United States Patent
Wu et al.

(10) Patent No.: US 9,231,071 B2
(45) Date of Patent: Jan. 5, 2016

(54) SEMICONDUCTOR STRUCTURE AND MANUFACTURING METHOD OF THE SAME

(71) Applicant: United Microelectronics Corp., Hsinchu (TW)

(72) Inventors: Hung-Yi Wu, Keelung (TW); Chien-Ming Lai, Tainan (TW); Yi-Wen Chen, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 63 days.

(21) Appl. No.: 14/187,701

(22) Filed: Feb. 24, 2014

(65) Prior Publication Data

US 2015/0243754 A1    Aug. 27, 2015

(51) Int. Cl.
H01L 21/44 (2006.01)
H01L 21/70 (2006.01)
H01L 29/49 (2006.01)
H01L 29/40 (2006.01)

(52) U.S. Cl.
CPC .......... *H01L 29/4966* (2013.01); *H01L 29/401* (2013.01); *H01L 29/4983* (2013.01)

(58) Field of Classification Search
CPC .................. H01L 21/28088; H01L 21/823828
USPC .......................................... 438/658; 257/407
See application file for complete search history.

(56) References Cited

U.S. PATENT DOCUMENTS

| | | | |
|---|---|---|---|
| 5,892,282 A | 4/1999 | Hong | |
| 6,066,533 A | 5/2000 | Yu | |
| 6,096,659 A | 8/2000 | Gardner | |
| 6,177,303 B1 | 1/2001 | Schmitz | |
| 6,303,418 B1 | 10/2001 | Cha | |
| 6,458,684 B1 | 10/2002 | Guo | |
| 6,492,217 B1 | 12/2002 | Bai | |
| 6,552,377 B1 | 4/2003 | Yu | |
| 6,573,134 B2 | 6/2003 | Ma | |
| 6,696,345 B2 | 2/2004 | Chau | |
| 6,790,719 B1 | 9/2004 | Adetutu | |
| 6,794,234 B2 | 9/2004 | Polishchuk | |
| 6,902,969 B2 | 6/2005 | Adetutu | |
| 6,921,711 B2 | 7/2005 | Cabral, Jr. | |
| 6,960,416 B2 | 11/2005 | Mui | |
| 7,030,430 B2 | 4/2006 | Doczy | |
| 7,074,664 B1 | 7/2006 | White | |
| 7,109,079 B2 | 9/2006 | Schaeffer, III | |
| 7,126,199 B2 | 10/2006 | Doczy | |
| 7,144,783 B2 | 12/2006 | Datta | |
| 7,148,548 B2 | 12/2006 | Doczy | |
| 7,153,784 B2 | 12/2006 | Brask | |
| 7,157,378 B2 | 1/2007 | Brask | |
| 7,176,090 B2 | 2/2007 | Brask | |
| 7,186,605 B2 | 3/2007 | Cheng | |
| 7,193,893 B2 | 3/2007 | Forbes | |

(Continued)

*Primary Examiner* — Caridad Everhart
(74) *Attorney, Agent, or Firm* — WPAT, PC; Justin King

(57) ABSTRACT

A semiconductor structure and a manufacturing method thereof are disclosed. The semiconductor structure includes an isolation layer, a gate dielectric layer, a first work function metal, a first bottom barrier layer, a second work function metal, and a first top barrier layer. The isolation layer is formed on a substrate and has a first gate trench. The gate dielectric layer is formed in the first gate trench. The first work function metal is formed on the gate dielectric layer in the first gate trench. The first bottom barrier layer is formed on the first work function metal. The second work function metal is formed on the first bottom barrier layer. The first top barrier layer is formed on the second work function metal.

14 Claims, 6 Drawing Sheets

(56) References Cited

U.S. PATENT DOCUMENTS

| | | |
|---|---|---|
| 7,208,361 B2 | 4/2007 | Shah |
| 7,208,366 B2 | 4/2007 | Tsai |
| 7,217,611 B2 | 5/2007 | Kavalieros |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,700,479 B2 | 4/2010 | Huang |
| 7,785,958 B2 | 8/2010 | Doczy |
| 8,536,038 B2 | 9/2013 | Wang |
| 8,551,876 B2 | 10/2013 | Wang |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0044783 A1 | 2/2010 | Chuang |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0244141 A1 | 9/2010 | Beyer |
| 2011/0223752 A1* | 9/2011 | Hing et al. ............ 438/585 |
| 2012/0129331 A1* | 5/2012 | Choi et al. ............ 438/592 |
| 2013/0026637 A1* | 1/2013 | Hou et al. ............ 257/770 |
| 2013/0049141 A1 | 2/2013 | Cheng |
| 2013/0099307 A1 | 4/2013 | Tseng |
| 2013/0102145 A1 | 4/2013 | Huang |
| 2013/0105903 A1 | 5/2013 | Chang |
| 2013/0105919 A1* | 5/2013 | Jiang et al. ............ 257/411 |
| 2013/0154012 A1 | 6/2013 | Fu |
| 2013/0168744 A1 | 7/2013 | Hsu |
| 2013/0241003 A1 | 9/2013 | Lin |

* cited by examiner

SEMICONDUCTOR STRUCTURE AND MANUFACTURING METHOD OF THE SAME

BACKGROUND

1. Technical Field

The disclosure relates in general to a semiconductor structure and a manufacturing method thereof, and more particularly to a semiconductor structure with a filling metal and a manufacturing method thereof.

2. Description of the Related Art

While the size of semiconductor devices, such as metal-oxide-semiconductors (MOS), scales down, the conventional polysilicon gates have faced a variety of problems. Accordingly, work function metals along with high-K gate dielectric layers are used in the semiconductor devices for replacing the conventional polysilicon gates and being used as control electrodes.

However, in such case, the manufacturing process as well as the structures of replaced metal gates is critical. Therefore, there is always a continuing need in improving the semiconductor processing to develop semiconductor devices with metal gates for providing superior performance and reliability.

SUMMARY OF THE INVENTION

The disclosure is directed to a semiconductor structure and a manufacturing method thereof. According to some embodiments of the present disclosure, the semiconductor structure is provided with a superior filling capacity, a filling metal with intact integrity, and the device adopting such semiconductor structure has improved performance and reliability.

According to an embodiment of the present disclosure, a semiconductor structure is disclosed. The semiconductor structure includes an isolation layer, a gate dielectric layer, a first work function metal, a first bottom barrier layer, a second work function metal, and a first top barrier layer. The isolation layer is formed on a substrate and has a first gate trench. The gate dielectric layer is formed in the first gate trench. The first work function metal is formed on the gate dielectric layer in the first gate trench. The first bottom barrier layer is formed on the first work function metal. The second work function metal is formed on the first bottom barrier layer. The first top barrier layer is formed on the second work function metal.

According to another embodiment of the present disclosure, a manufacturing method of a semiconductor structure is disclosed. The manufacturing method includes the following steps: forming an isolation layer on a substrate, comprising forming a first gate trench in the isolation layer; forming a gate dielectric layer in the first gate trench; forming a first work function metal on the gate dielectric layer in the first gate trench; forming a first bottom barrier layer on the first work function metal; forming a second work function metal on the first bottom barrier layer; and forming a first top barrier layer on the second work function metal.

The disclosure will become apparent from the following detailed description of the preferred but non-limiting embodiments. The following description is made with reference to the accompanying drawings.

DETAILED DESCRIPTION OF THE INVENTION

Figure 1:
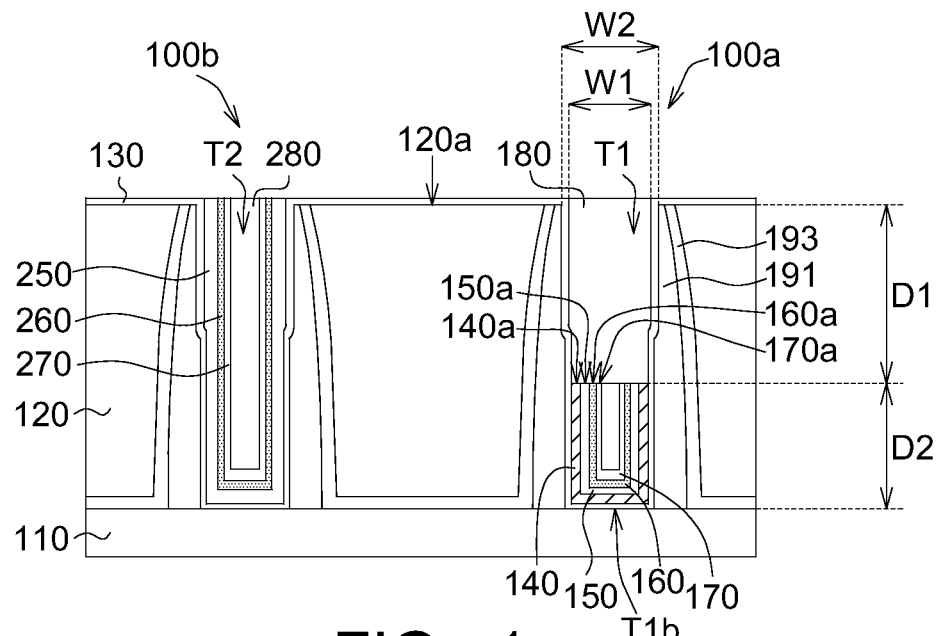
FIG. 1 shows a schematic diagram of a semiconductor structure 100 according to an embodiment of the present disclosure.

In some embodiments of the present disclosure, the semiconductor structure is provided with a superior filling capacity, a filling metal with intact integrity, and the device adopting such semiconductor structure has improved performance and reliability. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

FIG. 1 shows a schematic diagram of a semiconductor structure 100 according to an embodiment of the present disclosure. As shown in FIG. 1, the semiconductor structure 100 includes an isolation layer 120, a gate dielectric layer 130, a first work function metal 140, a first bottom barrier layer 150, a second work function metal 160, and a first top barrier layer 170. The isolation layer 120 is formed on a substrate 110 and has a first gate trench T1. The gate dielectric layer 130 is formed in the first gate trench T1. The first work function metal 140 is formed on the gate dielectric layer 130 in the first gate trench T1. The first bottom barrier layer 150 is formed on the first work function metal 140. The second work function metal 160 is formed on the first bottom barrier layer 150. The first top barrier layer 170 is formed on the second work function metal 160. In other words, as shown in FIG. 1, in the present embodiment, the first bottom barrier layer 150 is formed between the first work function metal 140 and the second work function metal 160.

In the embodiment, the isolation layer 120 is such as an inter-layer dielectric (ILD) layer, and the gate dielectric layer 130 is formed from at least a high-k material, such as rare earth metal oxide. In some embodiments, the gate dielectric layer 130 may include $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, SBT, PZT BST, or the combinations thereof. In an embodiment, the isolation layer 120 has a thickness of such as about 1050 Å, ad the substrate 110 has a thickness of about 300 Å.

In the embodiment, the first work function metal 140 is such as a p type work function metal and may include TiN, TaN, TiC, TaC, WC, TiAlN, or the combinations thereof, and the second work function metal 160 is such as an n type work function metal and may include TiAl, ZrAl, WAl, TaAl, HfAl, or the combinations thereof.

In some embodiments of the present disclosure, the first bottom barrier layer 150 and the first top barrier layer 170 may independently comprise TiN, TaN, Ti/TiN, Ta/TaN, or the combinations thereof.

As shown in FIG. 1, in the embodiment, the isolation layer 130 may further has a second gate trench T1 which is separated from the first gate trench T1, and the gate dielectric layer 130 is further formed in the second gate trench T2.

In the embodiment, the semiconductor structure 100 may further include a second bottom barrier layer 250, a third work function metal 260, and a second top barrier layer 270. The second bottom barrier layer 250 is formed on the gate dielectric layer 130 in the second gate trench T2. The third work function metal 260 is formed on the second bottom barrier layer 250 and is the same type of a work function metal as is the second work function metal 160. For example, the third work function metal 260 comprises the same material as that of the second work function metal 160. The second top barrier layer 270 is formed on the third work function metal 260. The second bottom barrier layer 250, the third work function metal 260, and the second top barrier layer 270 cover the sidewalls of the second gate trench T2.

In the embodiment, the second bottom barrier layer 250 and the second top barrier layer 270 may independently comprise TiN, TaN, Ti/TiN, Ta/TaN, or the combinations thereof.

As shown in FIG. 1, the first work function metal 140, the first bottom barrier layer 150, the second work function metal 160, and the first top barrier layer 170 may have U-shaped profile structures. In the present embodiment, as shown in FIG. 1, the top surface 140a of the first work function metal 140, the top surface 150a of the first bottom barrier layer 150, the top surface 160a of the second work function metal 160, and the top surface 170a of the first top barrier layer 170 are coplanar, and the top surfaces 140a, 150a, 160a, 170a are all below the top surface 120a of the isolation layer 120.

In an alternative embodiment (not shown), the semiconductor structure 100 further includes an additional top barrier layer (not shown) formed on the first work function metal 140, the first bottom barrier layer 150, the second work function metal 160, and the first top barrier layer 170. In the present embodiment, the additional top barrier layer may have a U-shaped profile structure and covers the sidewalls of the first gate trench T1, and a top surface of the additional top barrier layer is coplanar with the top surface 120a of the isolation layer 120.

In the present embodiment, the top surface 160a of the second work function metal 160 and the top surface 120a of the isolation layer 120 are separated by a first distance D1. The top surface 160a of the second work function metal 160a and the bottom surface T1b of the first gate trench T1 are separated by a second distance D2. A ratio of the first distance D1 to the second distance D2 is about 0.5-0.9.

As shown in FIG. 1, the semiconductor structure 100 may further comprise a first filling metal 180 formed on the first top barrier layer 170 in the first gate trench T1. In the present embodiment, a ratio of the width W1 of the first filling metal 180 to a width W2 of the first gate trench T1 is about 0.75-0.89.

As shown in FIG. 1, the semiconductor structure 100 may further comprise a second filling metal 280 formed on the second top barrier layer 270 in the second gate trench T2. In the embodiments of the present disclosure, the first filling metal 180 and the second filling metal 280 may independently include at least a material with low resistance and superior gap-filling characteristic, such as W, Al, TiAl, TiAlO, or combinations thereof.

As shown in FIG. 1, in the embodiment, the work function metal 140, 160, the barrier layers 150, 170, and the first filling metal 180 as whole form a first metal gate structure, and the work function metal 260, the barrier layers 250, 270, and the second filling metal 280 as whole form a second metal gate structure. The semiconductor structure 100 may further include spacers 191 located beside the first metal gate structure and the second gate structure. In the embodiment, the spacer 191 may include SiN, SiO, SiON, or the combinations thereof.

As shown in FIG. 1, the semiconductor structure 100 may further include a contact etch stop layer (CESL) 193 formed on the spacer 191 and the substrate 110.

In an embodiment, the semiconductor structure 100 may be a CMOS FinFET including a PFET 100a and a NFET 100b. In the present embodiment, the PFET 100a corresponds to the region of the first trench T1, and the NFET 100b corresponds to the region of the second trench T2. The substrate 110 may be a portion of a fin of the COMS FinFET.

The embodiments disclosed below are for elaborating a manufacturing method of the semiconductor structure 100 of the disclosure. However, the descriptions disclosed in the embodiments of the disclosure such as detailed manufacturing procedures are for illustration only, not for limiting the scope of protection of the disclosure. Referring to FIGS. 2A-2J, a manufacturing method of the semiconductor structure 100 according to an embodiment of the present disclosure is illustrated.

Figure 2A:
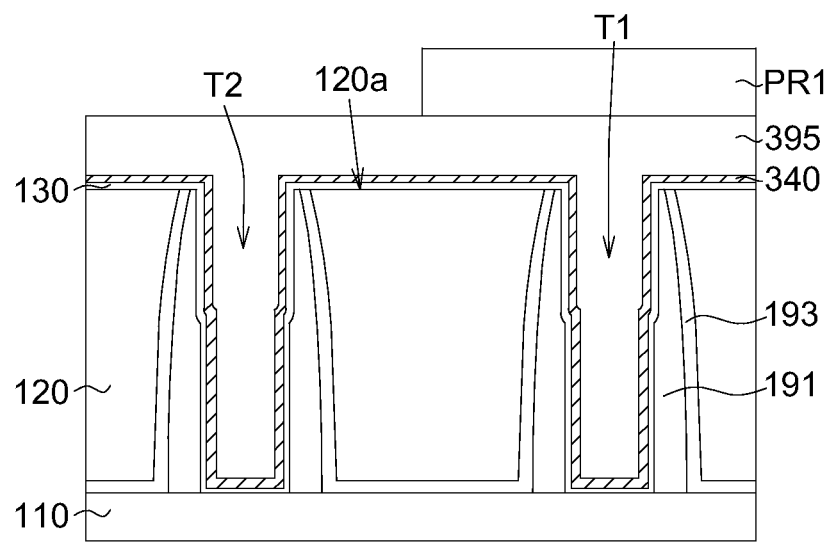
FIGS. 2A-2J illustrate a manufacturing method of the semiconductor structure according to an embodiment of the present disclosure.

Referring to FIG. 2A, the spacers 191, the CESL 193, and the isolation layer 120 are formed on the substrate 110. The formation of the isolation layer 120 comprises forming the first gate trench T1 in the isolation layer 120. Optionally, as shown in FIG. 2A, the second gate trench T2 is further formed in the isolation layer 120, wherein the second gate trench T2 is separated from the first gate trench T1. Next, the gate dielectric layer 130 is formed in the first gate trench T1. In the present embodiment, the gate dielectric layer 130 is also formed in the second gate trench T2 and on the top surface 120a of the isolation layer 120.

Still referring to FIG. 2A, a first work function metal material 340 is formed on the gate dielectric layer 130 in the first gate trench T1 as well as in the second gate trench T2. Next, a mask layer 395 is formed on the gate dielectric layer 130. As shown in FIG. 2A, the mask layer 395 covers the whole surface of the gate dielectric layer 130 and fills up the first gate trench T1 and the second gate trench T2. In the embodiment, the mask layer 395 includes such as a dielectric anti-reflection coating (DARC), a light absorbing oxide (DUO), a bottom anti-reflective coating (BARC), or a sacrificial light absorbing material (SALM), but not limited thereto. And then, a photoresist PR1 is disposed on the mask layer 395 corresponding to the region of the first gate trench T1. In the embodiment, the photoresist PR1 is formed by such as a photolithography process.

Figure 2B:
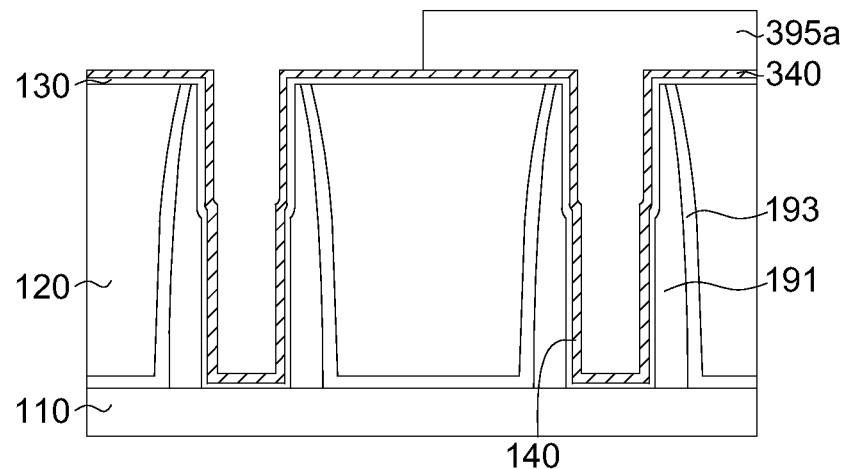

Referring to FIG. 2B, a portion of the mask layer 395 exposed from the photoresist PR1 is removed for forming a patterned mask layer 395a. In the embodiment, the portion of the mask layer 395 is removed by such as a dry etching process. As shown in FIG. 2B, the patterned mask layer 395a covers the region of the first gate trench T1 and the layers formed therein. In an embodiment, the first work function metal material 340 is such as a p type work function metal material, and the patterned mask layer 395 covers the region corresponding to a PFET of a CMOS Fin FET.

Figure 2C:
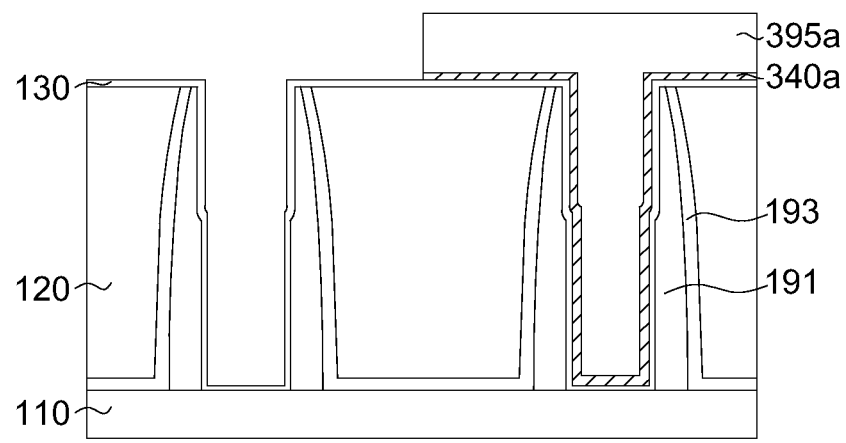

Referring to FIG. 2C, a portion of the first work function metal material 340 exposed from the patterned mask layer 395a is removed, and the remained first work function metal material 340a is formed correspondingly above the first gate trench T1. Specifically, the portion of the first work function metal material 340 located in the second gate trench T2 is removed, and the remained first work function metal material 340a protects the layers formed in the first gate trench T1. In the embodiment, the portion of the first work function metal material 340 is removed by such as a wet cleaning process, wherein a suitable solvent is used for dissolving the to-be-removed portion.

Figure 2D:
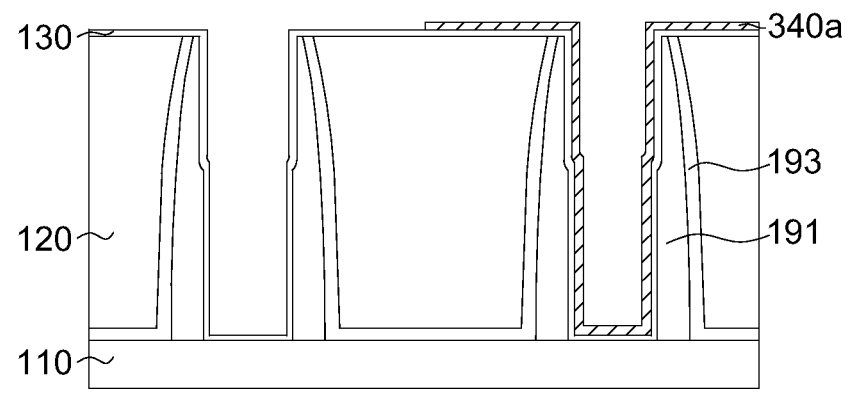

Referring to FIG. 2D, the patterned mask layer 395a is removed. In the embodiment, the patterned mask layer 395a is removed by such as a wet cleaning process.

Figure 2E:
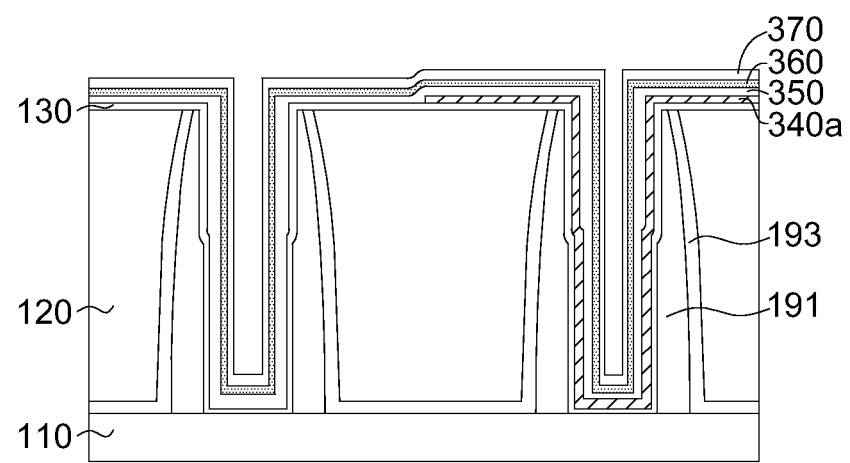

Referring to FIG. 2E, a bottom barrier material 350, a second work function metal material 360, and a top barrier material 370 are formed on the gate dielectric layer 130 and the remained first work function metal material 340*a*. In the present embodiment, the second work function metal material 360 is formed on the bottom barrier material 350, and the top barrier material 370 is formed on the second work function metal material 360. The materials 350, 360, and 370 are filled in the first gate trench T1 and in the second gate trench T2.

Figure 2F:
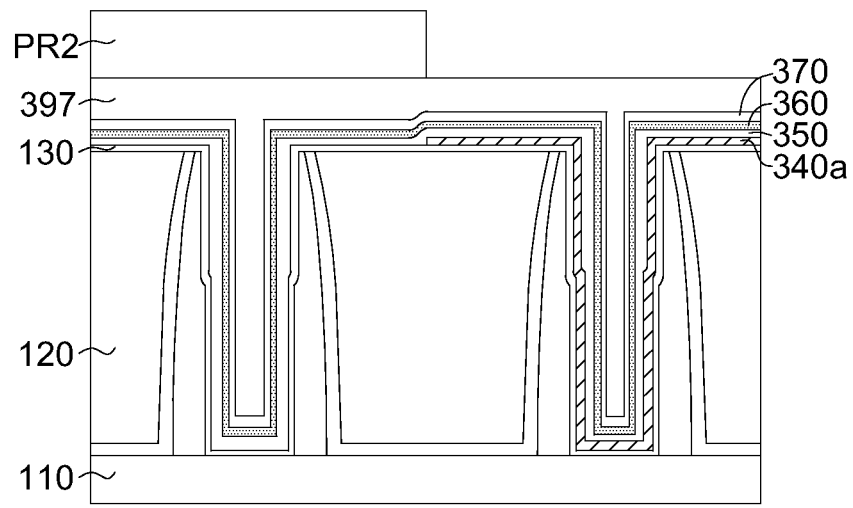

Referring to FIG. 2F, after the materials 350, 360, and 370 are formed on the gate dielectric layer 130 and filled in the first gate trench T1 and in the second gate trench T2, a mask layer 397 is formed on the top barrier material 370. As shown in FIG. 2F, the mask layer 397 covers the whole surface of the top barrier material 370 and fills up the first gate trench T1 and the second gate trench T2. In the embodiment, the mask layer 397 includes such as a dielectric anti-reflection coating (DARC), a light absorbing oxide (DUO), a bottom anti-reflective coating (BARC), or a sacrificial light absorbing material (SALM), but not limited thereto. And then, a photoresist PR2 is disposed on the mask layer 397 corresponding to the region of the second gate trench T2. In the embodiment, the photoresist PR2 is formed by such as a photolithography process.

Figure 2G:
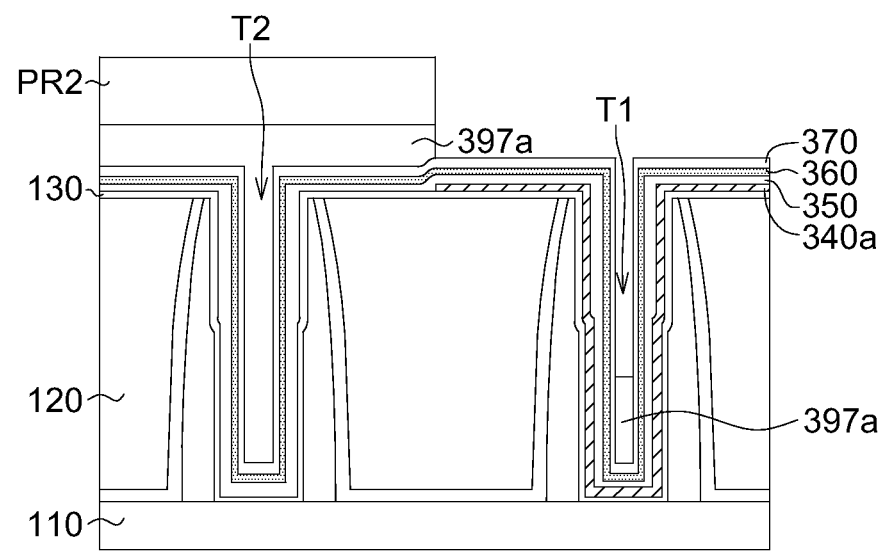

Referring to FIG. 2G, a portion of the mask layer 397 exposed from the photoresist PR2 is removed for forming a patterned mask layer 397*a*. As shown in FIG. 2G, the patterned mask layer 397*a* covers the region of the second gate trench T2 and the layers (gate dielectric layer 130 and materials 350, 360, and 370) formed therein, and the patterned mask layer 397*a* fills up a portion of the first gate trench T1. In the embodiment, the portion of the mask layer 397 is removed by such as a dry etching process.

Figure 2H:
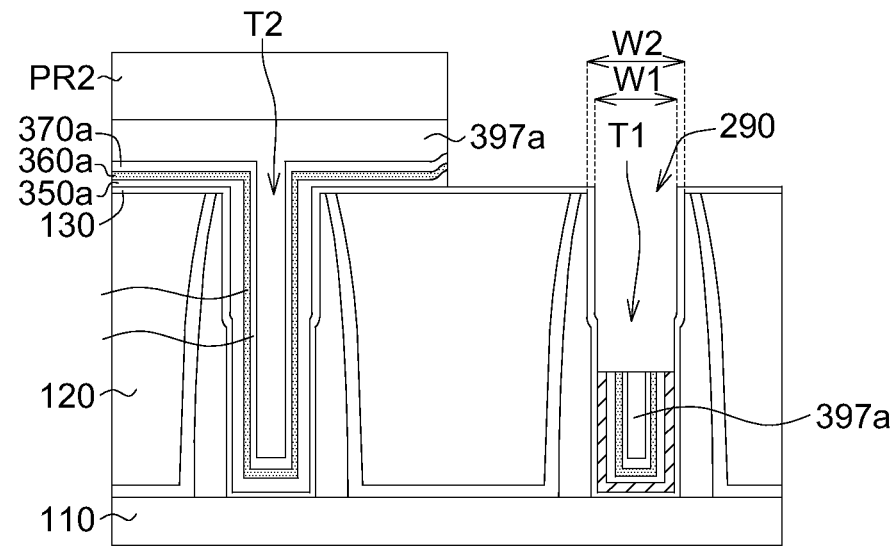

Referring to FIG. 2H, the remained first work function metal material 340*a* exposed from the patterned mask layer 397*a* is partially removed for forming the first work function metal 140, the bottom barrier material 350 exposed from the patterned mask layer 397*a* is partially removed for forming the first bottom barrier layer 150, the second work function metal material 360 exposed from the patterned mask layer 397*a* is partially removed for forming the second work function metal 160, and the top barrier material 370 exposed from the patterned mask layer 397*a* is partially removed for forming the first top barrier layer 170. The first work function metal 140 is formed on the gate dielectric layer 130 in the first gate trench T1, the first bottom barrier layer 150 is formed on the first work function metal 140, the second work function metal 160 is formed on the first bottom barrier layer 150, and the first top barrier layer 170 is formed on the second work function metal 160.

In the present embodiment, the remained first work function metal material 340*a*, the bottom barrier material 350, the second work function metal material 360, and the top barrier material 370 exposed from the patterned mask layer 397*a* are partially removed in the same manufacturing process. Since the remained first work function metal material 340*a*, the bottom barrier material 350, the second work function metal material 360, and the top barrier material 370 are pulled down all together in the same manufacturing process, as shown in FIG. 2H, a large opening with the width W1 is formed. In other words, the sidewalls of the first gate trench T1 are not fully covered by the bottom barrier material 350, the second work function metal material 360, and the top barrier material 370, leaving a relatively larger opening 290 within the first gate trench T1. In the embodiment, since the original width W2 of the first gate trench T1 is only reduced by the formation of the gate dielectric layer 130 on the sidewalls of the first gate trench T1, the as-formed large opening 290 is provided with a superior filling capacity for, for example, a metal material. In the present embodiment, a ratio of the width W1 of the opening 290 to the original width W2 of the first gate trench T1 is such as about 0.75-0.89.

Figure 2I:
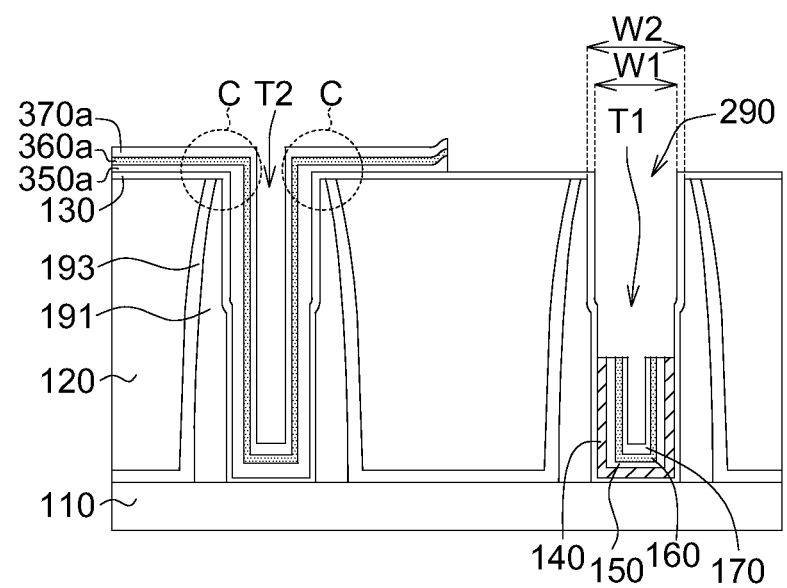

Referring to FIG. 2I, the patterned mask layer 397*a* is removed. In the embodiment, the patterned mask layer 397*a* is removed by such as a dry etching process. In this step, the remained bottom barrier material 350*a*, the remained second work function metal material 360*a*, and the remained top barrier material 370*a* cover the corner portions C (e.g. the gate dielectric layer 130 and the spacers 191) of the second gate trench T2; therefore, the structure of the corner portions C of the second gate trench T2 is not directly bombard by ions from the dry etching process, and the damage to the structure of the corner portions C of the second gate trench T2 which may be caused by a dry etching process is prevented. In this regard, the remained bottom barrier material 350*a*, the remained second work function metal material 360*a*, and the remained top barrier material 370*a* on the gate dielectric layer 130 in the second gate trench T2 are used not only as the work function metal and barrier layers for the NFET 100*b*, as previously described, but also as the protection layers for the structure of the second gate trench T2 in the manufacturing process. As the structure of the second gate trench T2 is sufficiently protected, the structure of the second filling metal 280, which will be formed in the second gate trench T2 in the following process, can maintain its intact integrity. In an embodiment, the second filling metal 280 is such as the replacement metal gate of a NFET of CMOS FinFET; accordingly, the intact integrity of the second filling metal 280 results in no height loss in the metal gate, and the performance and the reliability of the CMOS FinFET are thus improved.

Figure 2J:
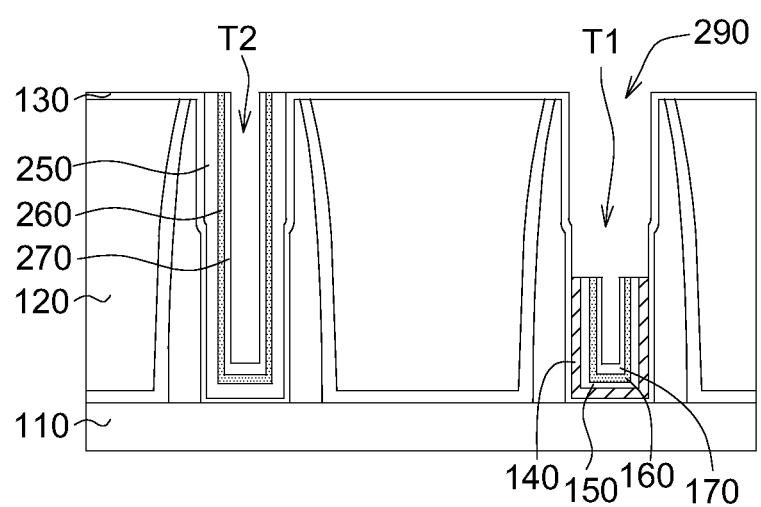

Referring to FIG. 2J, a planarization process is performed to partially remove the remained bottom barrier material 350*a*, the remained second work function metal material 360*a*, and the remained top barrier material 370*a* located correspondingly above the second gate trench T2. In the embodiment, the planarization process is such as a CMP process. The remained bottom barrier material 350*a* is partially removed for forming the second bottom barrier layer 250 on the gate dielectric layer 130 in the second gate trench T1. The remained second work function metal material 360*a* is partially removed for forming the third work function metal 260 on the second bottom barrier layer 250. The remained top barrier material 370*a* is partially removed for forming the second top barrier layer 270 on the third word function metal 260. As shown in FIG. 2J, the second bottom barrier layer 250, the third work function metal 260, and the second top barrier layer 270 cover the sidewalls of the second gate trench T2.

Next, referring to FIG. 1, a filling metal material (not shown) is formed on the first top barrier layer 170 in the first gate trench T1 and on the second top barrier layer 270 in the second gate trench T2. The filling metal material fills up the first gate trench T1 and the second gate trench T2. As the remained first work function metal material 340*a*, the bottom barrier material 350, the second work function metal material 360, and the top barrier material 370 are pulled down all together in the same manufacturing process to form a large opening 290 with the width W1, the gap filling capacity for the filling metal material in the first gate trench T1 is greatly improved.

And then, a planarization process is performed to remove unnecessary portions of the filling metal material for forming the first filling metal 180 in the first gate trench T1 and the second filling metal 280 in the second gate trench T2. As such, the semiconductor structure 100 a shown in FIG. 1 is manufactured.

In an alternative embodiment, an additional top barrier layer (not shown) is formed on the first work function metal 140, the first bottom barrier layer 150, the second work function metal 160, and the first top barrier layer 170 before the filling metal material is filled in the first gate trench T1 and the second gate trench T2. In the present embodiment, the additional top barrier layer covers the sidewalls of the first gate trench T1, and a top surface of the additional top barrier layer is coplanar with the top surface 120a of the isolation layer 120.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    an isolation layer formed on a substrate, wherein the isolation layer has a first gate trench and a second gate trench separated from the first gate trench;
    a gate dielectric layer formed in the first gate trench and in the second gate trench;
    a first work function metal formed on the gate dielectric layer in the first gate trench;
    a first bottom barrier layer formed on the first work function metal;
    a second work function metal formed on the first bottom barrier layer;
    a first top barrier layer formed on the second work function metal;
    a second bottom barrier layer formed on the gate dielectric layer in the second gate trench;
    a third work function metal formed on the second bottom barrier layer, the third work function metal comprising the same material with that of the second work function metal; and
    a second top barrier layer formed on the third work function metal;
    wherein the second bottom barrier layer, the third work function metal, and the second top barrier layer cover the sidewalls of the second gate trench.

2. The semiconductor structure according to claim 1, wherein the first work function metal, the first bottom barrier layer, the second work function metal, and the first top barrier layer have U-shaped profile structures.

3. The semiconductor structure according to claim 1, wherein top surfaces of the first work function metal, the first bottom barrier layer, the second work function metal, and the first top barrier layer are coplanar and below a top surface of the isolation layer.

4. The semiconductor structure according to claim 1, wherein a ratio of a first distance between the top surface of the second work function metal and the top surface of the isolation layer to a second distance between the top surface of the second work function metal and the bottom surface of the first gate trench is 0.5-0.9.

5. The semiconductor structure according to claim 1, further comprising:
    a first filling metal formed on the first top barrier layer in the first gate trench, wherein a ratio of a width of the first filling metal to a width of the first gate trench is 0.75-0.89.

6. The semiconductor structure according to claim 1, further comprising:
    a second filling metal formed on the second top barrier layer in the second gate trench.

7. The semiconductor structure according to claim 1, wherein the first bottom barrier layer and the first top barrier layer independently comprise TiN, TaN, Ti/TiN, Ta/TaN, or the combinations thereof.

8. A manufacturing method of a semiconductor structure, comprising:
    forming an isolation layer on a substrate, comprising forming a first gate trench and a second gate trench in the isolation layer, the second gate trench being separated from the first gate trench;
    forming a gate dielectric layer in the first gate trench and in the second gate trench;
    forming a first work function metal on the gate dielectric layer in the first gate trench;
    forming a first bottom barrier layer on the first work function metal;
    forming a second work function metal on the first bottom barrier layer;
    forming a first top barrier layer on the second work function metal;
    forming a second bottom barrier layer on the gate dielectric layer in the second gate trench;
    forming a third work function metal on the second bottom barrier layer, the third work function metal having the same material with that of the second work function metal; and
    forming a second top barrier layer on the third work function metal;
    wherein the second bottom barrier layer, the third work function metal, and the second top barrier layer cover the sidewalls of the second gate trench.

9. The manufacturing method according to claim 8, wherein the first work function metal, the first bottom barrier layer, the second work function metal, and the first top barrier layer have U-shaped profile structures.

10. The manufacturing method according to claim 8, wherein top surfaces of the first work function metal, the first bottom barrier layer, the second work function metal, and the first top barrier layer are coplanar and below a top surface of the isolation layer.

11. The manufacturing method according to claim 8, wherein a ratio of a first distance between the top surface of the second work function metal and the top surface of the isolation layer to a second distance between the top surface of the second work function metal and the bottom surface of the first gate trench is 0.5-0.9.

12. The manufacturing method according to claim 8, further comprising:
    forming a first filling metal on the first top barrier layer in the first gate trench, wherein a ratio of a width of the first filling metal to a width of the first gate trench is 0.75-0.89.

13. The manufacturing method according to claim 8, further comprising:
    forming a second filling metal on the second top barrier layer in the second gate trench.

14. The manufacturing method according to claim 8, wherein the first bottom barrier layer and the first top barrier layer independently comprise TiN, TaN, Ti/TiN, Ta/TaN, or the combinations thereof.

\* \* \* \* \*